United States Patent
Uetani

(10) Patent No.: US 9,184,393 B2
(45) Date of Patent: *Nov. 10, 2015

(54) COMPOSITION AND ORGANIC PHOTOELECTRIC CONVERTER

(75) Inventor: Yasunori Uetani, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 650 days.

This patent is subject to a terminal disclaimer.

(21) Appl. No.: 12/671,109

(22) PCT Filed: Aug. 8, 2008

(86) PCT No.: PCT/JP2008/064617
§ 371 (c)(1),
(2), (4) Date: Jan. 28, 2010

(87) PCT Pub. No.: WO2009/022733
PCT Pub. Date: Feb. 19, 2009

(65) Prior Publication Data
US 2010/0193033 A1    Aug. 5, 2010

(30) Foreign Application Priority Data
Aug. 10, 2007    (JP) .................. 2007-210257

(51) Int. Cl.
*H01L 31/0256*   (2006.01)
*H01L 51/00*     (2006.01)
(Continued)

(52) U.S. Cl.
CPC .......... *H01L 51/0043* (2013.01); *B82Y 10/00* (2013.01); *C08G 61/02* (2013.01);
(Continued)

(58) Field of Classification Search
CPC .............. Y02E 10/549; H01L 51/0036; H01L 51/0047; H01L 51/0043; H01L 51/0039; C08G 2261/91; C08K 2003/045
See application file for complete search history.

(56) References Cited

U.S. PATENT DOCUMENTS 8,114,956 B2 *   2/2012   Ie et al. .......................... 528/380
(Continued)

FOREIGN PATENT DOCUMENTS

EP    1447860 A1 *   8/2004   .............. H01L 51/20
(Continued)

OTHER PUBLICATIONS

English machine translation of JP 2005-150410 to Iwasa. Obtained from AIPN/JPO website on May 14, 2012.*
(Continued)

*Primary Examiner* — Michael Pepitone
*Assistant Examiner* — Michael A Salvitti
(74) *Attorney, Agent, or Firm* — Sughrue Mion, PLLC

(57) ABSTRACT

A composition containing a polymer having a structural unit represented by the following formula (1) and a structural unit represented by the following formula (2), and a fullerene with a carbon number of 70 or more or a fullerene derivative having a fullerene skeleton with a carbon number of 70 or more:

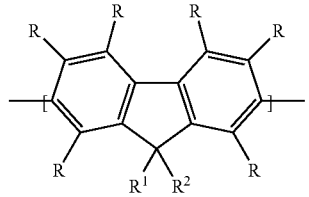

(1)

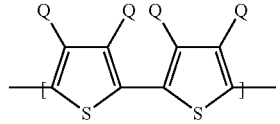

(2)

wherein, Q, R, $R^1$ and $R^2$ each independently denote a hydrogen atom, and so on.

10 Claims, 3 Drawing Sheets

(51) Int. Cl.
*B82Y 10/00* (2011.01)
*C08G 61/02* (2006.01)
*C08G 61/12* (2006.01)
*C08K 3/04* (2006.01)
*C08L 65/00* (2006.01)
*H01L 51/42* (2006.01)

(52) U.S. Cl.
CPC ............... *C08G 61/126* (2013.01); *C08K 3/04* (2013.01); *C08L 65/00* (2013.01); *H01L 51/0036* (2013.01); *H01L 51/0039* (2013.01); *C08G 2261/148* (2013.01); *C08G 2261/3142* (2013.01); *C08K 2003/045* (2013.01); *H01L 51/0047* (2013.01); *H01L 51/4253* (2013.01); *Y02E 10/549* (2013.01)

(56) References Cited

U.S. PATENT DOCUMENTS

| | | | |
|---|---|---|---|
| 2006/0141662 A1* | 6/2006 | Brabec et al. | 438/82 |
| 2006/0159611 A1 | 7/2006 | Hummelen et al. | |
| 2006/0174937 A1* | 8/2006 | Zhou | 136/263 |
| 2008/0003422 A1* | 1/2008 | Ueda | 428/220 |
| 2009/0278116 A1* | 11/2009 | Yamate | 257/40 |
| 2010/0084000 A1* | 4/2010 | Ueda | 136/244 |
| 2010/0116342 A1* | 5/2010 | Uetani et al. | 136/263 |
| 2010/0193033 A1* | 8/2010 | Uetani | 136/263 |
| 2010/0327271 A1* | 12/2010 | Uetani | 257/40 |
| 2011/0037066 A1* | 2/2011 | Uetani | 257/40 |
| 2011/0108884 A1* | 5/2011 | Uetani et al. | 257/184 |
| 2011/0114183 A1* | 5/2011 | Uetani et al. | 136/263 |
| 2011/0132453 A1* | 6/2011 | Uetani | 136/256 |
| 2012/0061659 A1* | 3/2012 | Seike | 257/40 |
| 2012/0100285 A1* | 4/2012 | Uetani | 427/108 |
| 2012/0111411 A1* | 5/2012 | Uetani et al. | 136/263 |
| 2014/0137919 A1* | 5/2014 | Nakao et al. | 136/244 |
| 2015/0155509 A1* | 6/2015 | Fukushima | 136/244 |

FOREIGN PATENT DOCUMENTS

| | | | |
|---|---|---|---|
| EP | 2067806 A1 | | 6/2009 |
| EP | 2130847 A1 | | 12/2009 |
| EP | 2246382 A1 | | 11/2010 |
| JP | 2005-150410 | * | 6/2005 |
| JP | 2006-222429 A | | 8/2006 |
| JP | 2006-518110 A | | 8/2006 |
| JP | 2006-312673 A | | 11/2006 |
| JP | 2008-106239 A | | 5/2008 |
| JP | 2008-106240 A | | 5/2008 |
| JP | 2008-247943 A | | 10/2008 |
| WO | 2005/092947 A1 | | 10/2005 |

OTHER PUBLICATIONS

Poly[(9,9-dioctylfluorenyl-2,7-diyl)-co-bithiophene] data sheet. Obtained from http://www.sigmaaldrich.com. No Author, No Date.*

Xia et al. Adv. Mater. 2008, 20, pp. 4810-4815.*

[70]PCBM. Obtained from: http://www.solennebv.com/index_htm_files/product-information-70PCBM.pdf. No Author, No Date.*

Mitchell G. Dibbs, et al., "Fluorene Arylene Copolymers for Organic Photovoltaic Devices," Proc SPIE, 2004, pp. 90-97, vol. 5520.

M. Reyes-Reyes, et al., High-efficiency photovoltaic devices based on annealed poly(3-hexyithiophene) and 1-(3-methoxycarbonyl)-propyl-1-phenyl-(6,6)C61 blends), Appl. Phys. Letters, 2005, pp. 083506.1-083506.3, vol. 87.

Xiangjun Wang, et al., "Enhanced Photocurrent Spectral Response in Low-Bandgap Polyfluorene and C-70-Derivative-Based Solar Cells," Adv. Funct. Mater., 2005, pp. 1665-1670, vol. 15.

Symposium of Applied Physics and Related Technology (Spring 2007)—Collection of Summaries 29a-V-10.

Examination Report dated Mar. 28, 2012, issued in corresponding British Patent Application No. 1002556.7.

R. A. Street and A. Salleo, Contact Effects in Polymer Transistors, Applied Physics Letters, vol. 81, No. 15, Oct. 7, 2002.

* cited by examiner

COMPOSITION AND ORGANIC PHOTOELECTRIC CONVERTER

TECHNICAL FIELD

The present invention relates to a composition and an organic photoelectric conversion element.

BACKGROUND ART

An organic semiconductor material having an electric charge (electron and hole) transport property is expected to be applied to an organic photoelectric conversion element (such as an organic solar cell and a photosensor), and an organic photoelectric conversion element such that a fullerene compound and a conjugated polymer are used as an electron acceptor and an electron donor respectively has been studied in recent years.

For example, Patent Document 1 discloses an organic photoelectric conversion element containing methyl[6,6]-phenyl-$C_{71}$-butyrate ([70]PCBM) as a $C_{70}$ fullerene compound and poly[2-methoxy-5-(3',7'-dimethyl-octyloxy)-p-phenylene-vinylene]. Nonpatent Document 1 discloses an organic photoelectric conversion element containing 3'-(3,5-bis-trifluoromethylphenyl)-1'-(4-nitrophenyl)pyrazolino [70]fullerene (BTPF70)) as a $C_{70}$ fullerene compound and a fluorene copolymer represented by the following formula.

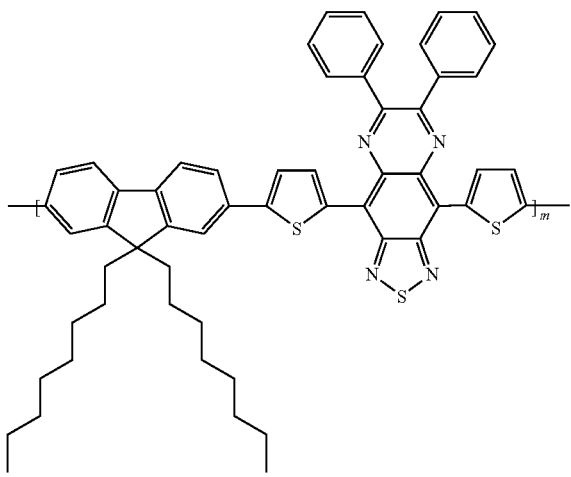

[Patent Document 1] Japanese translation of a PCT application No. 2006-518110
[Non-patent Document 1] Advanced Functional Materials, Vol. 15 (2005), 1665-1670

DISCLOSURE OF THE INVENTION

However, it was not necessarily easy yet that the above-mentioned organic photoelectric conversion element allowed sufficiently high photoelectric conversion efficiency in practical use.

Then, it is an object of the present invention to provide an organic photoelectric conversion element with sufficiently high photoelectric conversion efficiency, and an organic material capable of producing such an organic photoelectric conversion element.

In order to achieve the above object, the present invention provides a composition containing a polymer having a structural unit represented by the following formula (1) and a structural unit represented by the following formula (2), and a fullerene with a carbon number of 70 or more or a fullerene derivative having a fullerene skeleton with a carbon number of 70 or more.

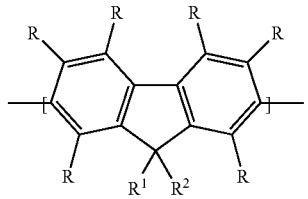

(1)

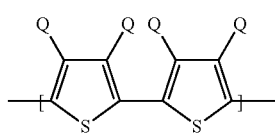

(2)

[In the formulae (1) and (2), Q, R, $R^1$ and $R^2$ each independently denote a hydrogen atom, a fluorine atom, an alkyl group with a carbon number of 1 to 20, an alkoxy group with a carbon number of 1 to 20, or an optionally substituted aryl group with a carbon number of 6 to 60 (wherein, a part or all of hydrogen atoms in the alkyl group with a carbon number of 1 to 20, the alkoxy group with a carbon number of 1 to 20, and the optionally substituted aryl group with a carbon number of 6 to 60 may be substituted with fluorine atoms.). $R^1$ and $R^2$ may be bonded together to form a ring. A plurality of Q's and R's may be the same or different.]

The use of the composition of the present invention as a material for an organic layer (an active layer) of an organic photoelectric conversion element allows an organic photoelectric conversion element with sufficiently high photoelectric conversion efficiency to be produced.

Further, the composition of the present invention is excellent in solubility in an organic solvent and can be coated or printed on an electrode, and therefore the use of the composition as a material for an organic layer (an active layer) of an organic photoelectric conversion element allows an organic photoelectric conversion element to be simply produced.

In the composition of the present invention, in view of easiness for producing a polymer, all of R's or Q's in the formulae (1) and (2) are preferably hydrogen atoms, and all of R's and Q's are more preferably hydrogen atoms.

In order to obtain an organic photoelectric conversion element with higher photoelectric conversion efficiency, the above-mentioned polymer is preferably a polymer having a structural unit represented by the following formula (I). From the same viewpoint, the structural unit represented by the following formula (I) is preferably a structural unit represented by the following formula (II) or (III). The structural unit represented by the following formula (II) is also preferable in view of solubility of the polymer in an organic solvent.

The structural unit represented by the following formula (III) is also preferable in view of easiness for producing the polymer.

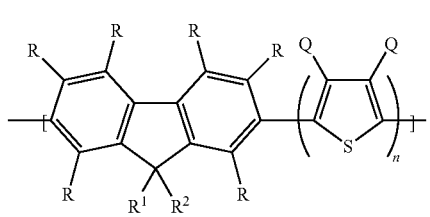

(I)

[In the formula (I), Q, R, $R^1$ and $R^2$ have the same meanings as described above, and n is an integer of 2 or more.]

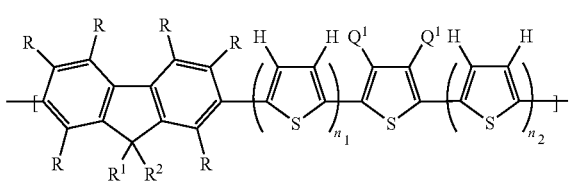
(II)

[In the formula (II), R, $R^1$ and $R^2$ have the same meanings as described above. $Q^1$ denotes an alkyl group with a carbon number of 1 to 20, an alkoxy group with a carbon number of 1 to 20, or an optionally substituted aryl group with a carbon number of 6 to 60 (wherein, a part or all of hydrogen atoms in the alkyl group with a carbon number of 1 to 20, the alkoxy group with a carbon number of 1 to 20, and the optionally substituted aryl group with a carbon number of 6 to 60 may be substituted with fluorine atoms.). $Q^1$s may be the same or different. $n_1$ and $n_2$ are integers of 0 or more and $n_1+n_2 \geq 1$.]

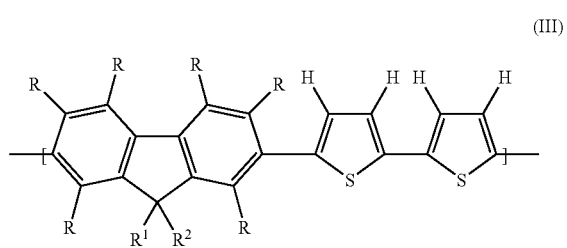
(III)

[In the formula (III), R, $R^1$ and $R^2$ have the same meaning as described above.]

The above-mentioned fullerene is preferably a fullerene with a carbon number of 70, and the above-mentioned fullerene derivative is preferably a fullerene derivative having a fullerene skeleton with a carbon number of 70. Such a fullerene or a fullerene derivative may absorb a spectrum of incident light (particularly sunlight) particularly efficiently, and therefore the use thereof allows an organic photoelectric conversion element with higher photoelectric conversion efficiency to be obtained. In view of photoelectric conversion efficiency of the organic photoelectric conversion element, the composition of the present invention preferably contains a fullerene derivative having a fullerene skeleton with a carbon number of 70, particularly, such as methyl[6,6]-phenyl-$C_{71}$-butyrate (occasionally referred to as '[70]PCBM' in the present specification).

The composition of the present invention may be used for forming an organic layer (an active layer) of an organic photoelectric conversion element. That is, the present invention also provides an organic photoelectric conversion element comprising a pair of electrodes at least one of which is transparent or translucent and an organic layer provided between the pair of electrodes, wherein the above-mentioned organic layer may be formed of the composition of the present invention. This organic photoelectric conversion element is an organic photoelectric conversion element with sufficiently high photoelectric conversion efficiency, as described above.

Figure 1:
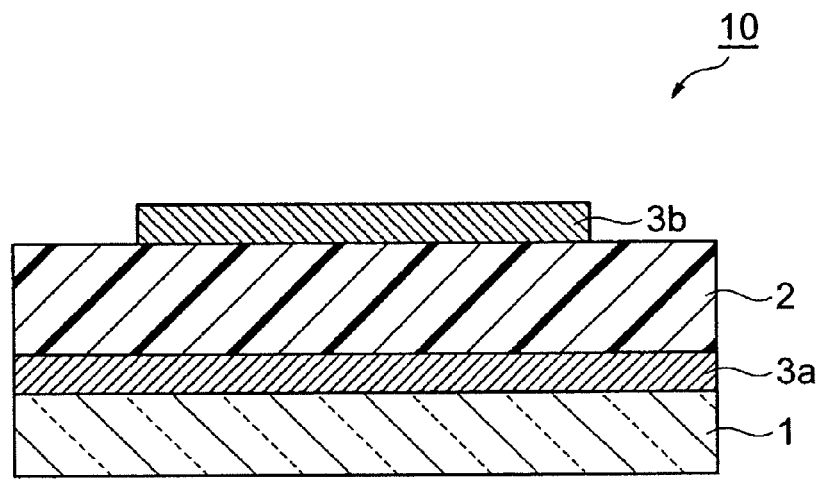
FIG. 1 is a schematic cross-sectional view of an organic photoelectric conversion element according to a first embodiment.

EXPLANATION OF REFERENCE NUMERALS 10, 20, 30, 40, 50 - - - organic photoelectric conversion element, 1 - - - substrate, 2 - - - organic layer, 3a - - - first electrode, 3b - - - second electrode, 4 - - - electric charge transport layer, 5 - - - buffer layer

BEST MODE FOR CARRYING OUT THE INVENTION

Preferred embodiments of the present invention are hereinafter described in detail while occasionally referring to figures. In the figures, the same reference numerals are given to the same elements and duplicate descriptions are omitted. The dimensional ratio of the figures is not limited to the ratio shown in the figures. In the present description, the 'structural unit' represented by a formula includes a structural unit represented by a formula obtained by reversing the formula from right to left.

[Composition]

The composition of the present invention contains a polymer having a structural unit represented by the following formula (1) and a structural unit represented by the following formula (2), and a fullerene with a carbon number of 70 or more or a fullerene derivative having a fullerene skeleton with a carbon number of 70 or more. The use of the composition of the present invention as a material for an organic layer (an active layer) of an organic photoelectric conversion element allows an organic photoelectric conversion element with sufficiently high photoelectric conversion efficiency to be produced. That is, the composition of the present invention is also a composition for an organic photoelectric conversion element.

<Polymer>

A polymer contained in the composition of the present invention has a structural unit of the following formula (1) and a structural unit of the following formula (2), and may function as an electron donor of an organic photoelectric conversion element. The structural units of the formulae (1) and (2) in the above-mentioned polymer may each be only one kind or two or more kinds.

In the present specification, one or more of each kind of the structural units has only to exist in a 'polymer', and two or more of the same kind of the structural units do not always need to exist in the 'polymer'.

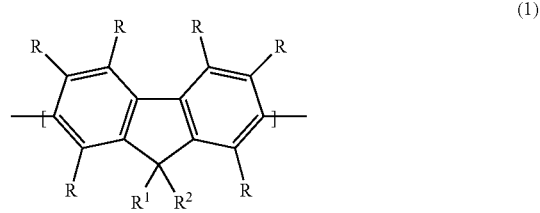
(1)

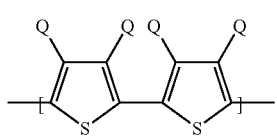

(2)

In the formulae (1) and (2), Q, R, $R^1$ and $R^2$ each independently denote a hydrogen atom, a fluorine atom, an alkyl group with a carbon number of 1 to 20, an alkoxy group with a carbon number of 1 to 20, or an optionally substituted aryl group with a carbon number of 6 to 60 (wherein, a carbon number of a substituent which may be optionally included in the aryl group is not included in the 'carbon number' of the aryl group.). $R^1$ and $R^2$ may be bonded together to form a ring. Q's and R's may be the same or different.

Examples of the alkyl group with a carbon number of 1 to 20 include a methyl group, an ethyl group, an n-propyl group, an isopropyl group, an n-butyl group, an isobutyl group, a tert-butyl group, a sec-butyl group, a 3-methyl butyl group, a pentyl group, a hexyl group, a 2-ethylhexyl group, a heptyl group, an octyl group, a nonyl group, a decyl group, and a lauryl group. In view of a balance between solubility of a polymer in an organic solvent and photoelectric conversion efficiency of an organic photoelectric conversion element, the alkyl group with a carbon number of 1 to 10 is preferable, and a pentyl group, a hexyl group, a 2-ethylhexyl group, an octyl group and a decyl group are particularly preferable. A part or all of hydrogen atoms included in these alkyl groups may be substituted with fluorine atoms; specific examples of the alkyl groups substituted with fluorine atoms include a trifluoromethyl group, a pentafluoroethyl group, a perfluorobutyl group, a perfluorohexyl group, and a perfluorooctyl group.

Examples of the alkoxy group with a carbon number of 1 to 20 include a methoxy group, an ethoxy group, an n-propyloxy group, an isopropyloxy group, an n-butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a lauryloxy group. A part or all of hydrogen atoms included in these alkoxy groups may be substituted with fluorine atoms; specific examples of the alkoxy groups substituted with fluorine atoms include a trifluoromethoxy group, a pentafluoroethoxy group, a perfluorobutoxy group, a perfluorohexyloxy group, and a perfluorooctyloxy group.

In a case where the optionally substituted aryl group with a carbon number of 6 to 60 has a substituent, examples of the substituent include a straight-chain, branched or cyclic alkyl group with a carbon number of 1 to 20, or an alkoxy group including in the structure thereof a straight-chain, branched or cyclic alkyl group with a carbon number of 1 to 20; a straight-chain, branched or cyclic alkyl group with a carbon number of 1 to 12 is preferable. A part or all of hydrogen atoms included in these aryl groups (including hydrogen atoms in a substituent in a case where the aryl group has the substituent) may be substituted with fluorine atoms. Examples of the optionally substituted aryl group with a carbon number of 6 to 60 include a phenyl group, a $C_1$ to $C_{12}$ alkoxyphenyl group ('$C_1$ to $C_{12}$ alkoxy' means that the carbon number of the alkoxy moiety is 1 to 12, the same applies hereinafter), a $C_1$ to $C_{12}$ alkylphenyl group ('$C_1$ to $C_{12}$ alkyl' means that the carbon number of the alkyl moiety is 1 to 12, the same applies hereinafter), a $C_1$ to $C_{12}$ alkoxy $C_1$ to $C_{12}$ alkoxyphenyl group, a 1-naphtyl group and a 2-naphtyl group; the aryl group with a carbon number of 6 to 20 is preferable, and a $C_1$ to $C_{12}$ alkoxyphenyl group, a $C_1$ to $C_{12}$ alkylphenyl group and a $C_1$ to $C_{12}$ alkoxy $C_1$ to $C_{12}$ alkoxyphenyl group are more preferable.

In order to obtain an organic photoelectric conversion element with higher photoelectric conversion efficiency, $R^1$ and $R^2$ are each preferably an alkyl group with a carbon number of 1 to 20, an alkoxy group with a carbon number of 1 to 20, or an optionally substituted aryl group with a carbon number of 6 to 60. In view of easiness for producing a polymer, all of R's or Q's are preferably hydrogen atoms, and all of R's and Q's are more preferably hydrogen atoms.

Examples of the structural unit of the formula (1) include structural units represented by the following formulae. A part or all of hydrogen atoms in the structural unit represented by the following formula may be substituted with other substituents. Examples of the substituents include atoms and groups denoted by R in the formula (1) except hydrogen atoms.

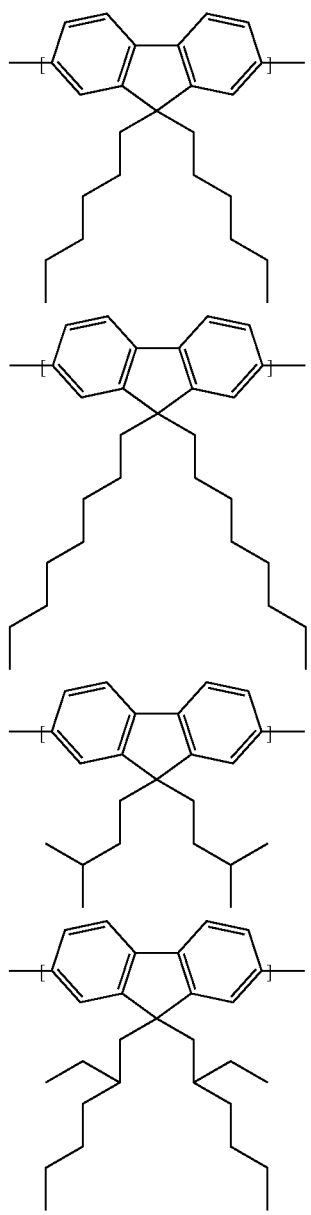

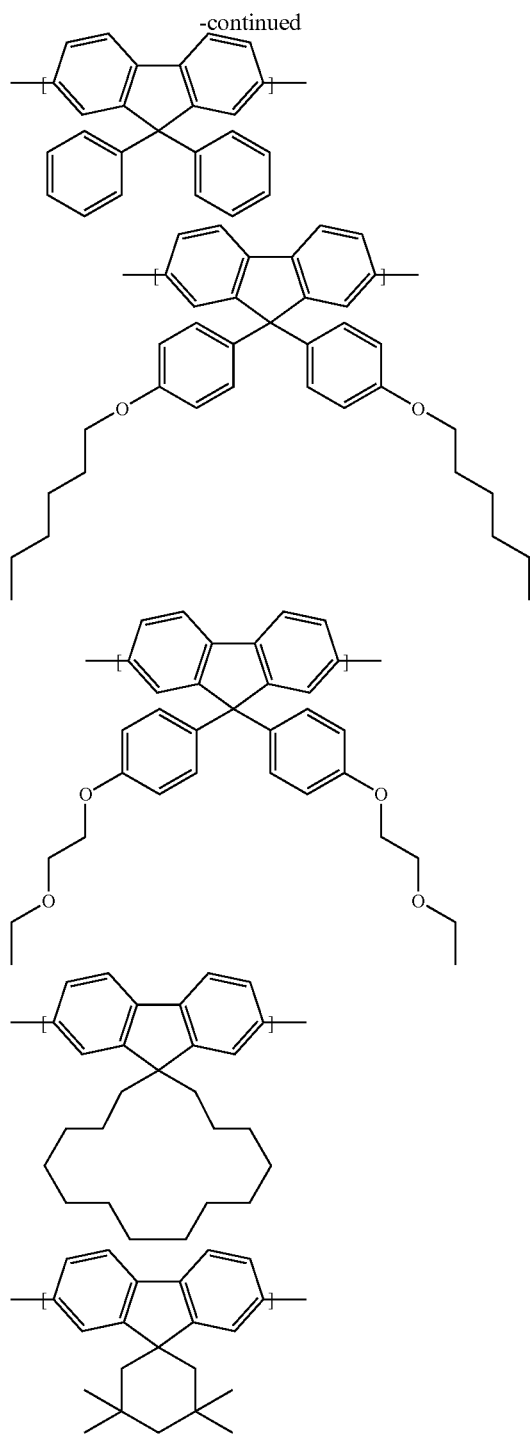
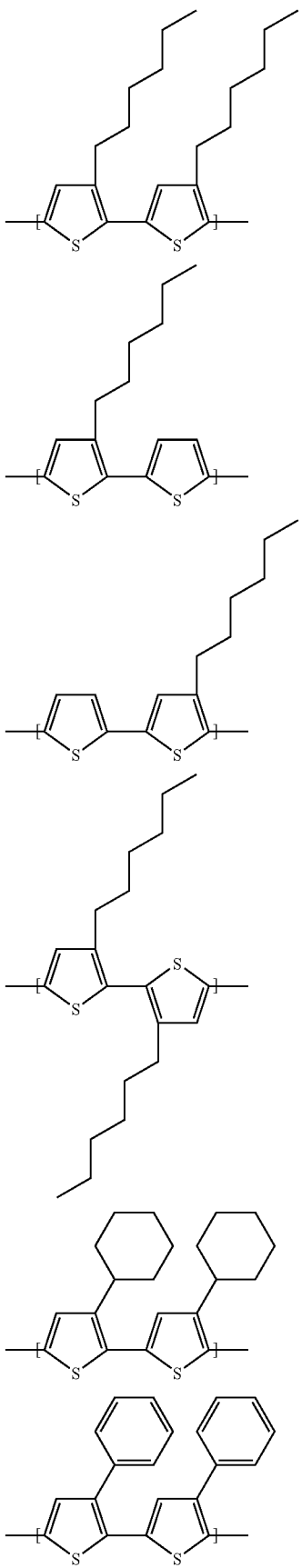
Examples of the structural unit of the formula (2) include structural units represented by the following formulae. The structural unit represented by the following formulae is preferable in view of improving an electric charge transport property of a polymer.
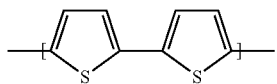

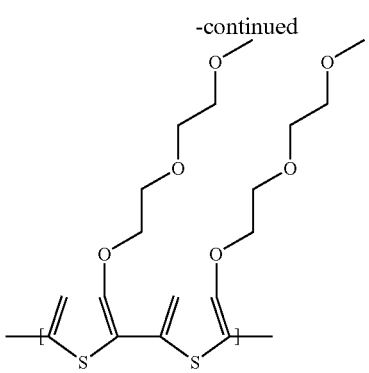

In the above-mentioned polymer, each of the structural units of the formulae (1) and (2) has only to exist, but two or more of them preferably exist two or more in order to obtain an organic photoelectric conversion element with higher photoelectric conversion efficiency. From the same viewpoint, the ratio ($p_1:p_2$) of the number of moles $p_1$ of the structural unit of the formula (1) to the number of moles $p_2$ of the structural unit of the formula (2) is preferably 1:9 to 7:1, more preferably 1:7 to 5:1, far more preferably 1:5 to 3:1, yet far more preferably 1:4 to 2:1, and particularly preferably 1:3 to 1.5:1.

The structural unit of the formula (2) may be combined with other structural units. For example, a structural unit represented by the following formula is preferable in view of realizing longer absorption wavelength of a polymer while improving an electric charge transport property of a polymer.

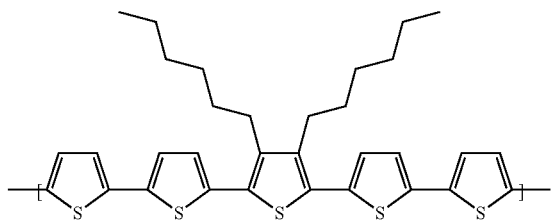

In order to obtain an organic photoelectric conversion element with higher photoelectric conversion efficiency, with regard to the polymer contained in the composition of the present invention;

a polymer having the structural unit of the formula (1) and the structural unit of the formula (2) as a structural unit including a structure in which these structural units are directly bonded to each other is preferable, and a polymer having a structural unit represented by the following formula (I) is more preferable.

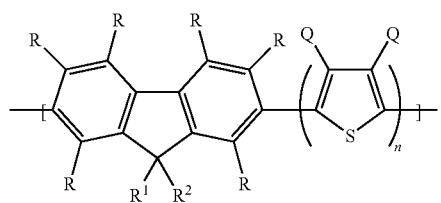

(I)

In the formula (I), Q, R, $R^1$ and $R^2$ have the same meanings as described above, and n is an integer of 2 or more. n is preferably 10 or less in view of easiness for producing a polymer, solubility of a polymer in an organic solvent, photoelectric conversion efficiency of an organic photoelectric conversion element, and the like.

Preferable examples of the polymer having a structural unit of the formula (I) include a polymer represented by the following formula (IV). The polymer represented by the following formula (IV) is particularly preferable in view of easiness of production.

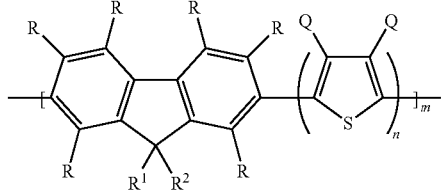

(IV)

In the formula (IV), Q, R, $R^1$, $R^2$ and n have the same meanings as described above, and m is an integer of 2 or more. m is preferably 3 or more, more preferably 10 or more in view of photoelectric conversion efficiency of an organic photoelectric conversion element, a coating property of a liquid composition, and the like.

Examples of an atom or a group at the end of the polymer represented by the formula (IV) include a halogen atom, an alkylsulfo group, an arylsulfo group, an arylalkylsulfo group, a boric acid ester residue, a sulfonium methyl group, a phosphonium methyl group, a phosphonate methyl group, a monohalogenated methyl group, a boric acid residue (—B(OH)$_2$), a formyl group, a cyano group, a vinyl group, a hydrogen atom, a fluorine atom, an alkyl group, an alkoxy group, an acyl group, an amino group and a polysilsesquioxane residue. A group having an aryl group or a heterocyclic group bonded to the end of the polymer through a carbon-to-carbon bond may be bonded to the end of the polymer represented by the formula (IV). Examples of such a group include groups described in [Chemical Formula 10] of Japanese Unexamined Patent Publication No. 9-45478, including groups represented by the following formulae.

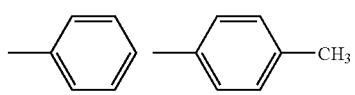

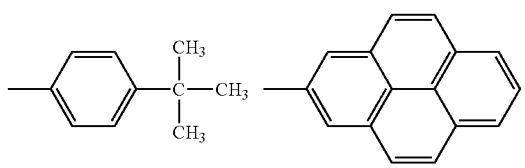

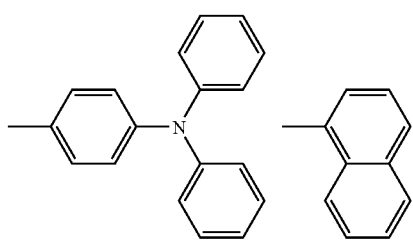

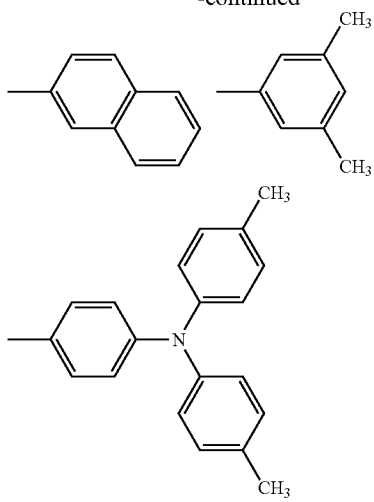

Examples of the polysilsesquioxane residue include groups represented by the following formula (W).

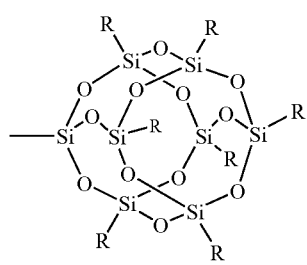

[In the formula (W), R denotes an isobutyl group.]

In order to obtain an organic photoelectric conversion element with higher photoelectric conversion efficiency, the structural unit of the formula (I) is preferably a structural unit represented by the following formula (II) or (III). The structural unit of the following formula (II) is also preferable in view of solubility of a polymer in an organic solvent. The structural unit of the following formula (III) is also preferable in view of easiness for producing a polymer.

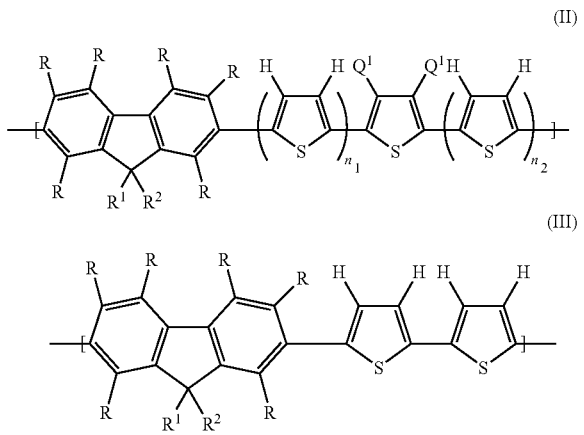

In the formulae (II) and (III), R, $R^1$ and $R^2$ have the same meanings as described above. $Q^1$ denotes an alkyl group with a carbon number of 1 to 20, an alkoxy group with a carbon number of 1 to 20, or an optionally substituted aryl group with a carbon number of 6 to 60 (wherein, a part or all of hydrogen atoms in the alkyl group with a carbon number of 1 to 20, the alkoxy group with a carbon number of 1 to 20, and the optionally substituted aryl group with a carbon number of 6 to 60 may be substituted with fluorine atoms.). $Q^1$s may be the same or different. $n_1$ and $n_2$ are integers of 0 or more and $n_1+n_2 \geq 1$. $n_1$ and $n_2$ are each preferably 5 or less, more preferably 3 or less and preferably $n_1+n_2 \leq 10$ in view of easiness for producing a polymer, solubility of a polymer in an organic solvent, photoelectric conversion efficiency of an organic photoelectric conversion element, and the like.

In order to obtain an organic photoelectric conversion element with higher photoelectric conversion efficiency, the polymer contained in the composition of the present invention is preferably a polymer having plural structural units including the structural unit represented by the formula (1) and the structural unit represented by the formula (2). From the same viewpoint, the structural unit is preferably the structural unit represented by the formula (I), for example. Preferable examples of the polymer having the plural structural units represented by the formula (I) include the polymer represented by the formula (IV). In view of photoelectric conversion efficiency of an organic photoelectric conversion element and the like, the structural unit of the formula (I) is preferably the structural unit represented by the formula (II) or (III), for example.

The polymer contained in the composition of the present invention may further have at least one structural unit except the structural units represented by the formulae (1) and (2) in order to improve solubility in an organic solvent. Examples of the structural unit except the structural units of the formulae (1) and (2) include structural units represented by the following formulae (3) and (4-A) to (4-H). In the following formulae (3) and (4-A) to (4-H), R has the same meaning as described above. R's may be the same or different.

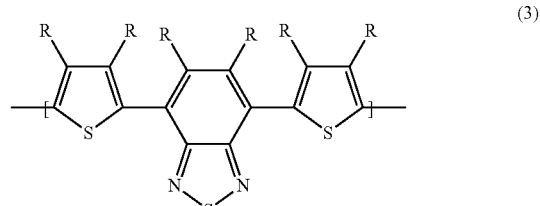

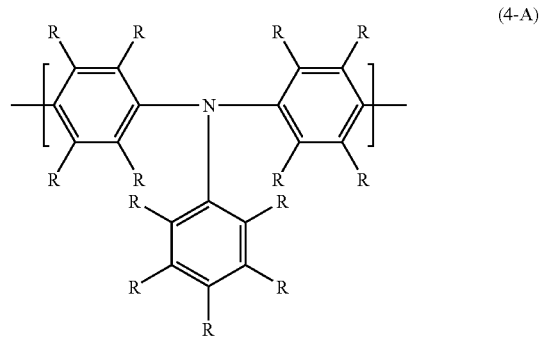

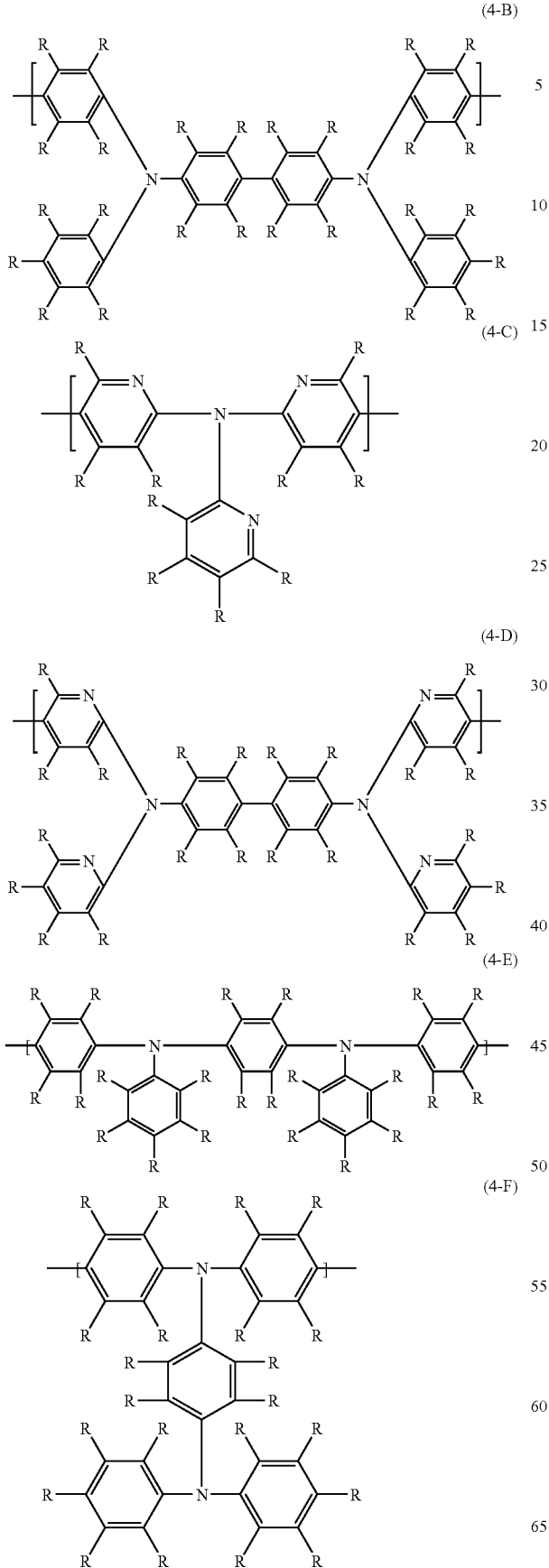
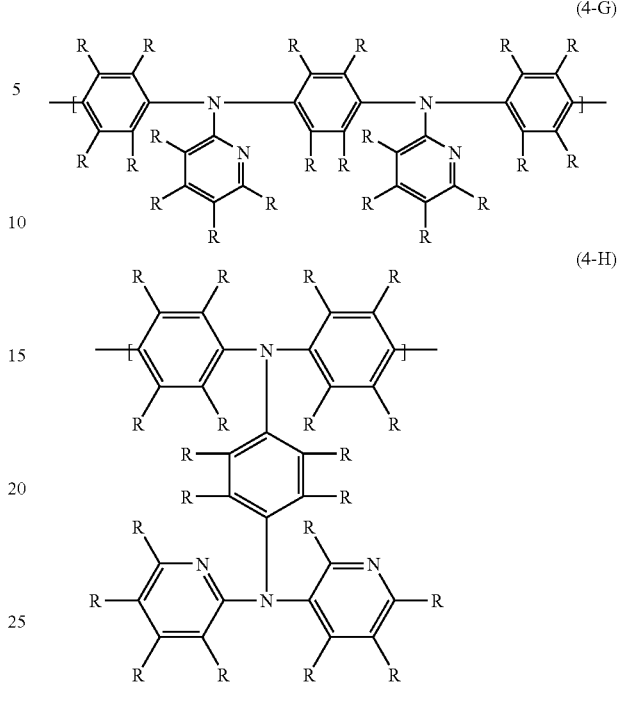

For example, in a polymer in which a moiety except the end of the polymer is composed of the structural unit of the formula (1), the structural unit of the formula (2) and the structural unit of anyone of the formulae (3) and (4-A) to (4-H), the total amount of the structural unit of the formula (1) and the structural unit of the formula (2) is ordinarily 1 to 99% by mol with respect to the total amount (number of moles) of all structural units in the polymer (moieties except the end), preferably 5 to 95% by mol and more preferably 10 to 90% by mol in view of photoelectric conversion efficiency of an organic photoelectric conversion element.

The number average molecular weight of a polymer in terms of polystyrene is preferably $1 \times 10^3$ to $1 \times 10^8$, more preferably $1 \times 10^3$ to $1 \times 10^7$ in view of photoelectric conversion efficiency of an organic photoelectric conversion element, solubility of a polymer in an organic solvent, and the like. The weight average molecular weight of a polymer in terms of polystyrene is preferably $1 \times 10^3$ to $1 \times 10^8$, more preferably $1 \times 10^3$ to $1 \times 10^7$ in view of photoelectric conversion efficiency of an organic photoelectric conversion element, solubility of a polymer in an organic solvent, and the like. The number average molecular weight and weight average molecular weight of a polymer in terms of polystyrene may be measured by using gel permeation chromatography (GPC).

When a group involved in condensation polymerization remains as it is at the end of a polymer, the use of a composition containing the polymer for producing an organic photoelectric conversion element brings a possibility of deteriorating photoelectric conversion efficiency, so that the end of the polymer may be protected by a stable protective group. The stable protective group is preferably a group having a conjugated bond connected to a conjugated structure of the main chain, such as a group having an aryl group or a heterocyclic group bonded to the end of the polymer through a carbon-to-carbon bond. Examples of the group having an aryl group or a heterocyclic group bonded to the end of the polymer through a carbon-to-carbon bond include groups described in [Chemical Formula 10] of Japanese Unexamined Patent Publication No. 9-45478, including groups represented by the following formulae. A group or an atom at the end of the polymer may be a hydrogen atom, a fluorine atom, an alkyl group, an alkoxy group, an acyl group, an amino group and the like, or a polysilsesquioxane residue (such as the group represented by the formula (W)).

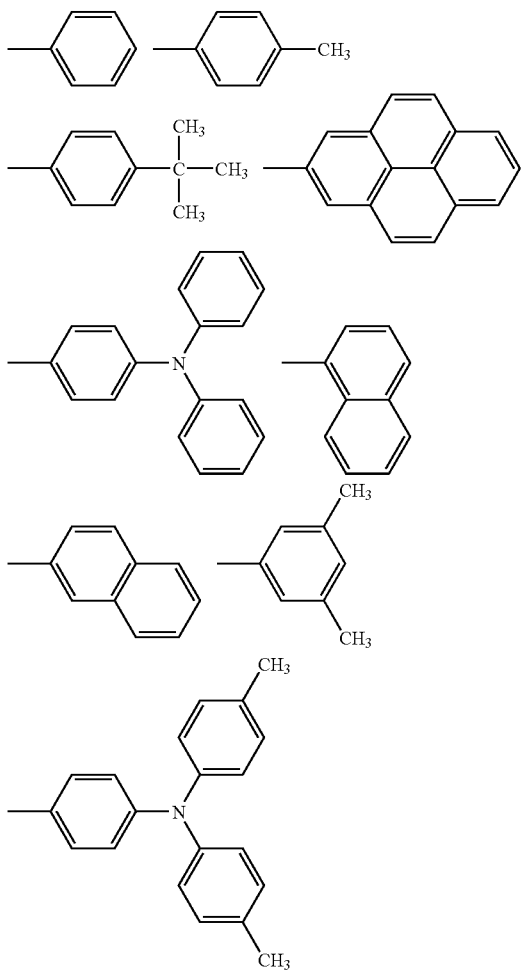

Examples of a favorable solvent for the polymer having the structural units represented by the formulae (1) and (2) include chloroform, methylene chloride, dichloroethane, tetrahydrofuran, toluene, xylene, mesitylene, tetralin, decalin and n-butylbenzene. One tenth percent (0.1%) by weight or more of the above-mentioned polymer may be ordinarily dissolved in these solvents, depending on the structure and molecular weight of the polymer.

<Method for Producing Polymer>

The polymer having the structural units represented by the formulae (1) and (2) may be produced by any method, for example, by using a compound represented by the formula: $Y^1$—$Ar^1$—$Y^2$ and a compound represented by the formula: $Y^3$—$Ar^2$—$Y^4$ as raw materials, these are subjected to condensation polymerization to produce the polymer. Here, —$Ar^1$— denotes the structural unit represented by the formula (1), —$Ar^2$— denotes the structural unit represented by the formula (2) and $Y^1$ to $Y^4$ each independently denote a substituent involved in condensation polymerization.

Examples of the substituents involved in condensation polymerization ($Y^1$ to $Y^4$) include a halogen atom, an alkylsulfo group, an arylsulfo group, an arylalkylsulfo group, a boric acid ester residue, a sulfonium methyl group, a phosphonium methyl group, a phosphonate methyl group, a monohalogenated methyl group, a boric acid residue (—B(OH)$_2$), a formyl group, a cyano group, and a vinyl group.

Examples of the above-mentioned alkylsulfo group include a methanesulfo group, an ethanesulfo group, and a trifluoromethanesulfo group.

Examples of the above-mentioned arylsulfo group include a benzenesulfo group, and a para-toluenesulfo group e.

Examples of the above-mentioned arylalkylsulfo group include a benzylsulfo group and the like.

Examples of the above-mentioned boric acid ester residue include groups represented by the following formulae. Me denotes a methyl group and Et denotes an ethyl group (the same applies hereinafter).

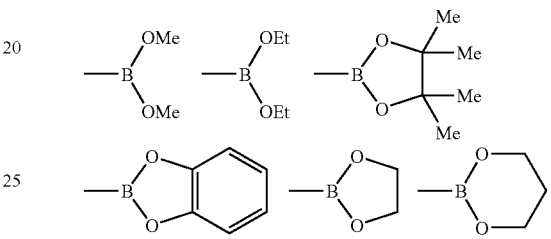

Examples of the above-mentioned sulfonium methyl group include groups represented by the following formulae. Ph denotes a phenyl group (the same applies hereinafter).

—CH$_2$S$^+$Me$_2$X$^-$

—CH$_2$S$^+$Ph$_2$X$^-$

[In the formulae, X denotes a halogen atom.]

Examples of the above-mentioned phosphonium methyl group include groups represented by the following formula.

—CH$_2$P$^+$Ph$_3$X$^-$

[In the formula, X denotes a halogen atom.]

Examples of the above-mentioned phosphonate methyl group include groups represented by the following formula.

—CH$_2$PO(OR')$_2$

[In the formula, R' denotes an alkyl group, an aryl group or an arylalkyl group. Two R's may be the same or different.]

Examples of the above-mentioned monohalogenated methyl group include a methyl fluoride group, a methyl chloride group, a methyl bromide group, and a methyl iodide group.

Preferable substituents as the substituents involved in condensation polymerization ($Y^1$ to $Y^4$) vary with kinds of polymerization reactions; for example, they are a halogen atom, an alkylsulfo group, an arylsulfo group, an arylalkylsulfo group and the like in reaction by using a zerovalent nickel complex (Ni(0)complex) (such as Yamamoto coupling reaction), and are an alkylsulfo group, a halogen atom, a boric acid ester residue, —B(OH)$_2$ and the like in reaction by using a nickel catalyst or a palladium catalyst (such as Suzuki coupling reaction).

The polymer having the structural units represented by the formulae (1) and (2) may be produced, for example, in such a manner that a compound (monomer) having two 'substituents involved in condensation polymerization' is dissolved in an organic solvent as required and reacted at a temperature of the melting point or more and the boiling point or less of the organic solvent by using alkali or a suitable catalyst. The polymer may be produced by other known methods described in, for example, "Organic Reactions", Volume 14, pages 270 to 490, John Wiley & Sons, Inc., 1965, "Organic Synthesis", Collective Volume VI, pages 407 to 411, John Wiley & Sons, Inc., 1988, Chem. Rev., Volume 95, page 2457 (1995), J. Organomet. Chem., Volume 576, page 147 (1999), and Macromol. Chem. Macromol. Symp., Volume 12, page 229 (1987).

In the production of a polymer, known condensation reactions may be used in accordance with the substituents involved in condensation polymerization ($Y^1$ to $Y^4$). For example, a method for polymerizing the corresponding monomer using Suzuki coupling reaction, a method for polymerizing using Grignard reaction, a method for polymerizing using a zerovalent nickel complex, a method for polymerizing using an oxidant such as $FeCl_3$, a method for carrying out electrochemical oxidative polymerization, and a method by decomposition of an intermediate polymer having a suitable leaving group are exemplified; in view of easiness of structure control, a method for polymerizing using Suzuki coupling reaction, a method for polymerizing using Grignard reaction, and a method for polymerizing using a zerovalent nickel complex are preferable.

The method for producing a polymer is particularly preferably a production method in which condensation polymerization is carried out in the presence of a zerovalent nickel complex, wherein the substituents involved in condensation polymerization ($Y^1$ to $Y^4$) is each independently selected from a halogen atom, an alkylsulfo group, an arylsulfo group and an arylalkylsulfo group. Examples of starting compounds include a dihalogenated compound, a bis(alkylsulfonate) compound, a bis(arylsulfonate) compound, a bis(arylalkylsulfonate) compound, a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound and an arylsulfonate-arylalkylsulfonate compound. A polymer with controlled sequence may be produced by using as starting compounds, for example, a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound or an arylsulfonate-arylalkylsulfonate compound.

The method for producing a polymer is also preferably a production method in which condensation polymerization is carried out with the use of a nickel catalyst or a palladium catalyst, wherein the substituents involved in condensation polymerization ($Y^1$ to $Y^4$) is each independently selected from a halogen atom, an alkylsulfo group, an arylsulfo group, an arylalkylsulfo group, a boric acid residue and a boric acid ester residue, and the ratio K/J between the total (J) of the number of moles of a halogen atom, an alkylsulfo group, an arylsulfo group and an arylalkylsulfo group in all starting compounds, and the total (K) of the number of moles of a boric acid residue and a boric acid ester residue is substantially 1 (ordinarily 0.7 to 1.2).

Examples of the above-mentioned starting compounds include a combination of a dihalogenated compound, a bis (alkylsulfonate) compound, a bis(arylsulfonate) compound or a bis(arylalkylsulfonate) compound and a diboric acid compound or a diboric acid ester compound; or a halogen-boric acid compound, a halogen-boric acid ester compound, an alkylsulfonate-boric acid compound, an alkylsulfonate-boric acid ester compound, an arylsulfonate-boric acid compound, an arylsulfonate-boric acid ester compound, an arylalkylsulfonate-boric acid compound, an arylalkylsulfonate-boric acid ester compound or the like. A polymer with controlled sequence may be produced by using as starting compounds, for example, a halogen-boric acid compound, a halogen-boric acid ester compound, an alkylsulfonate-boric acid compound, an alkylsulfonate-boric acid ester compound, an arylsulfonate-boric acid compound, an arylsulfonate-boric acid ester compound, an arylalkylsulfonate-boric acid compound or an arylalkylsulfonate-boric acid ester compound.

A solvent used for the reaction varies with compounds to be used, reactions and the like, and is generally preferably subjected to sufficient deoxygenation for restraining a side reaction. From the same viewpoint, the reaction is preferably advanced under an inert atmosphere. In addition, from the same viewpoint, the solvent used for the reaction is generally preferably subjected to dehydration, but is not limited thereto in the case of the reaction in a two-phase system with water such as Suzuki coupling reaction.

Examples of the solvent include saturated hydrocarbons such as pentane, hexane, heptane, octane, cyclohexane and decalin; aromatic hydrocarbons such as benzene, toluene, ethylbenzene, n-butylbenzene, xylene and tetralin; halogenated saturated hydrocarbons such as carbon tetrachloride, chloroform, dichloromethane, chlorobutane, bromobutane, chloropentane, bromopentane, chlorohexane, bromohexane, chlorocyclohexane and bromocyclohexane; halogenated aromatic hydrocarbons such as chlorobenzene, dichlorobenzene and trichlorobenzene; alcohols such as methanol, ethanol, propanol, isopropanol, butanol and tert-butyl alcohol; carboxylic acids such as formic acid, acetic acid and propionic acid; ethers such as dimethyl ether, diethyl ether, methyl-tert-butyl ether, tetrahydrofuran, tetrahydropyran and dioxane; amines such as trimethylamine, triethylamine, N,N,N',N'-tetramethylethylenediamine and pyridine; and amides such as N,N-dimethylformamide, N,N-dimethylacetamide, N,N-diethylacetamide and N-methylmorpholine oxide: ethers are preferable, and tetrahydrofuran and diethyl ether are particularly preferable. These solvents may be used alone or in combination of two or more kinds.

In order to promote the reaction, alkali or a suitable catalyst is preferably added properly to the reaction system. These may be selected in accordance with reactions to be used, and the alkali or catalyst is preferably dissolved sufficiently in the solvent used for the reaction. Examples of the alkali include inorganic bases such as potassium carbonate and sodium carbonate; organic bases such as triethylamine; and inorganic salts such as cesium fluoride. Examples of the catalyst include palladium[tetrakis(triphenylphosphine)] and palladium acetates. Examples of a method for mixing the alkali or catalyst include methods for stirring a reaction solution under an inert atmosphere such as argon and nitrogen while slowly adding a solution of the alkali or catalyst thereto, or methods for slowly adding a reaction solution to a solution of the alkali or catalyst.

In a case where the composition containing the polymer having the structural units of the formulae (1) and (2) is used for producing an organic photoelectric conversion element, the purity of the polymer influences element performance such as photoelectric conversion efficiency of an organic photoelectric conversion element, so that a monomer before being polymerized is preferably polymerized in producing the polymer after being purified by methods such as distillation, purification by sublimation and recrystallization. Refinement treatment such as purification by reprecipitation and fractionation by chromatography is preferably performed after being polymerized.

<Fullerene or Fullerene Derivative>

A fullerene with a carbon number of 70 or more or a fullerene derivative having a fullerene skeleton with a carbon number of 70 or more may function as an electron acceptor of an organic photoelectric conversion element. The carbon number of the fullerene or the carbon number of a fullerene skeleton (a carbon cluster) in the fullerene derivative is preferably 960 or less, more preferably 240 or less, far more preferably 96 or less. Examples of the fullerene or the fullerene skeleton with a carbon number of 70 to 96 include a fullerene or a fullerene skeleton with $C_{70}$, $C_{76}$, $C_{78}$, $C_{80}$, $C_{82}$, $C_{84}$, $C_{86}$, $C_{88}$, $C_{90}$, $C_{92}$, $C_{94}$ or $C_{96}$. Examples of the fullerene derivative include fullerene derivatives represented by the following formulae.

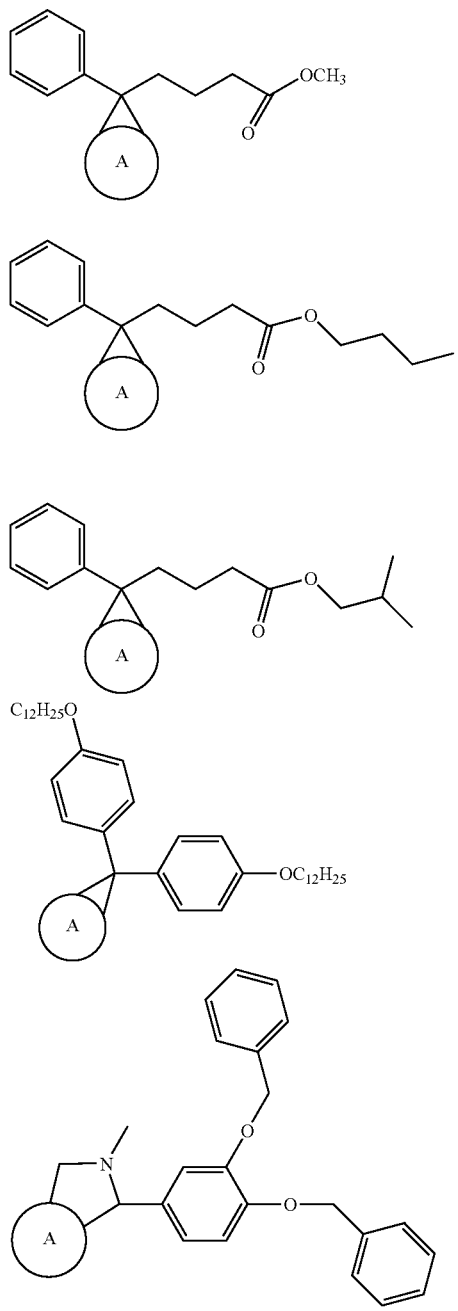

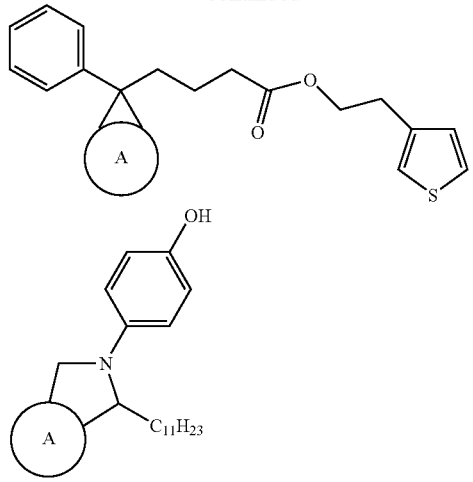

[In the formulae, A denotes a fullerene skeleton with a carbon number of 70 or more. In a fullerene derivative represented by each of the formulae, two adjacent carbon atoms in the fullerene skeleton form a cyclopropane ring or a pyrrolidine ring together with atoms in an additional group.]

The above-mentioned fullerene is preferably a fullerene with a carbon number of 70 and the above-mentioned fullerene derivative is preferably a fullerene derivative having a fullerene skeleton with a carbon number of 70. Such a fullerene or a fullerene derivative is so comparatively large in absorbance at 500 to 600 nm as to be capable of absorbing a spectrum of incident light (particularly sunlight) particularly efficiently, and whereby the use thereof allows an organic photoelectric conversion element with higher photoelectric conversion efficiency to be obtained. In view of photoelectric conversion efficiency of an organic photoelectric conversion element, the composition of the present invention preferably contains a fullerene derivative having a fullerene skeleton with a carbon number of 70, particularly, such as methyl[6,6]-phenyl-$C_{71}$-butyrate ('[70]PCBM').

In order to obtain an organic photoelectric conversion element with sufficiently high photoelectric conversion efficiency, the content (the total of the contents of a fullerene and a fullerene derivative in the case of containing both of them) of a fullerene with a carbon number of 70 or more or a fullerene derivative having a fullerene skeleton with a carbon number of 70 or more in the composition of the present invention is preferably 10 to 2000 parts by weight, more preferably 50 to 1500 parts by weight, far more preferably 200 to 1000 parts by weight with respect to 100 parts by weight of the polymer having the structural units represented by the formulae (1) and (2).

In the present description, a 'fullerene derivative' refers to a compound such that a functional group (such as a solvent-soluble group) is added to a fullerene. The addition of a functional group to a fullerene may be performed, for example, through the production of a pyrrolidine ring using Prato reaction (1,3-dipole addition reaction of azomethine ylide); the production of a cyclopropane ring using Bingel reaction; the production of a cyclized adduct using Diels-Alder reaction; or the production of a methanofullerene using a diazo compound.

In order to improve an electric charge (electron or hole) transport property of an organic layer of an obtained organic photoelectric conversion element, the composition of the present invention may further contain the fullerene with a carbon number of 70 or more or the fullerene derivative having a fullerene skeleton with a carbon number of 70 or more and the polymer having the structural unit of the formula (1) and the structural unit of the formula (2) as well as an electron acceptor or an electron donor except those described above.

Examples of the above-mentioned electron donor include a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine in a side chain or the main chain, polyaniline and a derivative thereof, polythiophene and a derivative thereof, polypyrrole and a derivative thereof, polyphenylene vinylene and a derivative thereof, and polythienylene vinylene and a derivative thereof.

Examples of the above-mentioned electron acceptor include an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, 8-hydroxyquinoline and a metal complex of a derivative thereof, polyquinoline and a derivative thereof, polyquinoxaline and a derivative thereof, polyfluorene and a derivative thereof, a fullerene with $C_{60}$ and a derivative thereof, and a phenanthrene derivative such as bathocuproine.

The composition of the present invention may be composed of only the above-mentioned various electron donors and electron acceptors, or further contain a solvent capable of dissolving these components. Further, the composition of the present invention may be solid or liquid.

Examples of the solvent capable of dissolving the above-mentioned various components include unsaturated hydrocarbon solvents such as toluene, xylene, mesitylene, tetralin, decalin, bicyclohexyl, n-butylbenzene, sec-butylbenzene and tert-butylbenzene; halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane and bromocyclohexane; halogenated unsaturated hydrocarbon solvents such as chlorobenzene, dichlorobenzene and trichlorobenzene; and ether solvents such as tetrahydrofuran and tetrahydropyran.

In a case where the solvent is contained in the composition, preferable content of the solvent may be properly determined by kinds of solvents, coating methods to be used and the like, and is ordinarily 100 to 10000000 parts by weight, preferably 1000 to 1000000 parts by weight, more preferably 1000 to 100000 parts by weight with respect to 100 parts by weight of the solid content (solid component) in the composition.

[Organic Photoelectric Conversion Element]

The organic photoelectric conversion element (such as a solar cell and a photosensor) of the present invention comprises a pair of electrodes at least one of which is transparent or translucent and an organic layer provided between the pair of electrodes, and is characterized in that the organic layer may be formed of the composition of the present invention. The organic photoelectric conversion element of the present invention includes sufficiently high photoelectric conversion efficiency by having such characteristics.

FIG. 1 is a schematic cross-sectional view of an organic photoelectric conversion element according to a first embodiment. An organic photoelectric conversion element 10 according to the first embodiment comprises a substrate 1, a first electrode 3a formed on the substrate 1, an organic layer (an active layer) 2 formed on the first electrode 3a, and a second electrode 3b formed on the organic layer 2.

Figure 2:
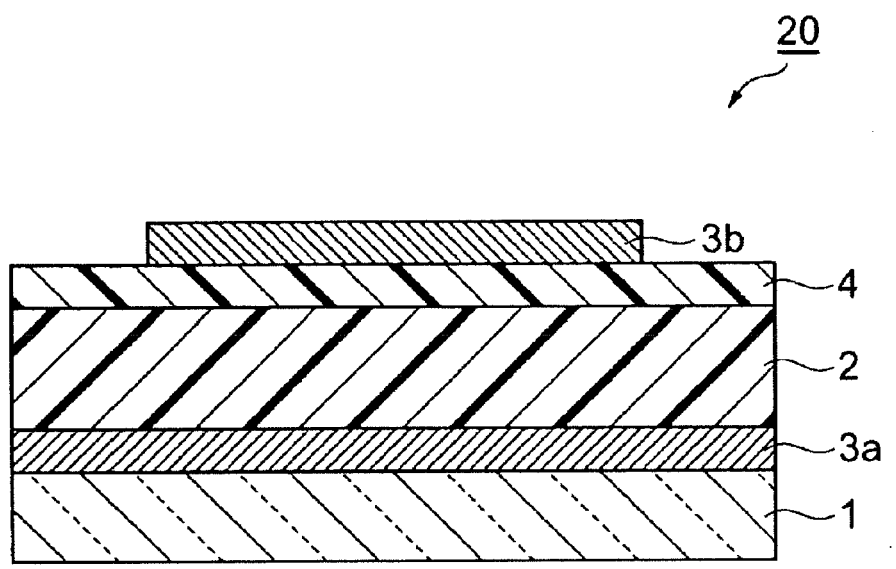
FIG. 2 is a schematic cross-sectional view of an organic photoelectric conversion element according to a second embodiment.

FIG. 2 is a schematic cross-sectional view of an organic photoelectric conversion element according to a second embodiment. An organic photoelectric conversion element 20 according to the second embodiment comprises a substrate 1, a first electrode 3a formed on the substrate 1, an organic layer (an active layer) 2 formed on the first electrode 3a, an electric charge transport layer 4 formed on the organic layer 2, and a second electrode 3b formed on the electric charge transport layer 4.

Figure 3:
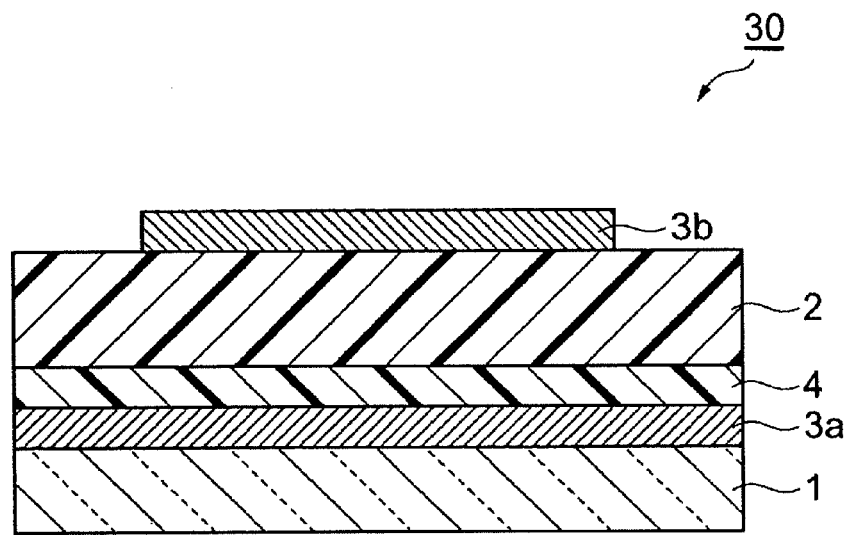
FIG. 3 is a schematic cross-sectional view of an organic photoelectric conversion element according to a third embodiment.

FIG. 3 is a schematic cross-sectional view of an organic photoelectric conversion element according to a third embodiment. An organic photoelectric conversion element 30 according to the third embodiment comprises a substrate 1, a first electrode 3a formed on the substrate 1, an electric charge transport layer 4 formed on the first electrode 3a, an organic layer (an active layer) 2 formed on the electric charge transport layer 4, and a second electrode 3b formed on the organic layer 2.

Figure 4:
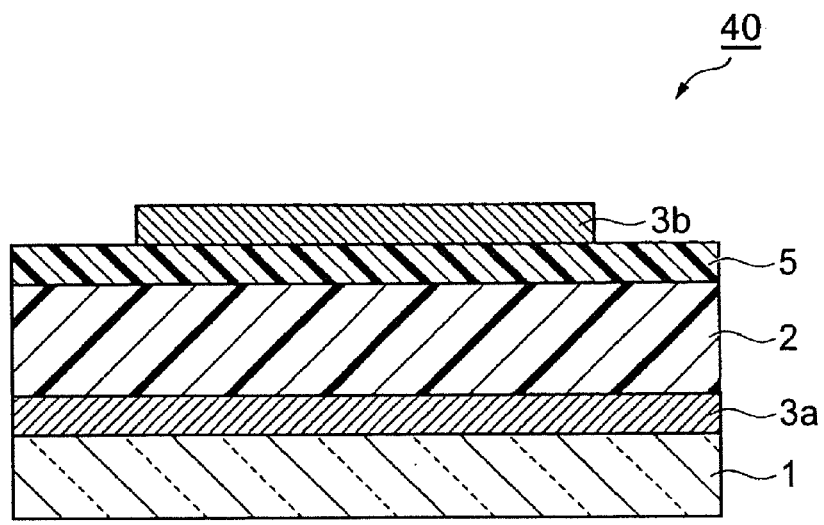
FIG. 4 is a schematic cross-sectional view of an organic photoelectric conversion element according to a fourth embodiment.

FIG. 4 is a schematic cross-sectional view of an organic photoelectric conversion element according to a fourth embodiment. An organic photoelectric conversion element 40 according to the fourth embodiment comprises a substrate 1, a first electrode 3a formed on the substrate 1, an organic layer (an active layer) 2 formed on the first electrode 3a, a buffer layer 5 formed on the organic layer 2, and a second electrode 3b formed on the buffer layer 5.

Figure 5:
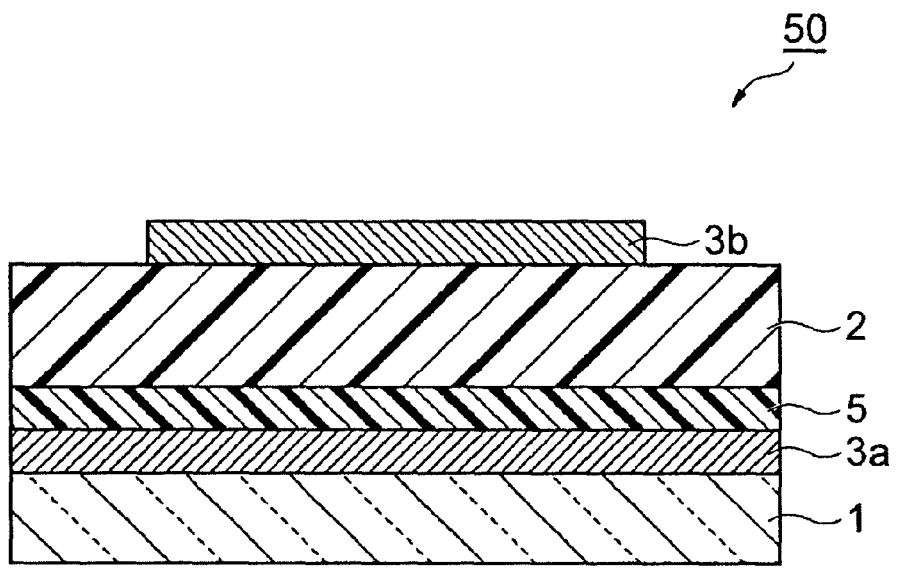
FIG. 5 is a schematic cross-sectional view of an organic photoelectric conversion element according to a fifth embodiment.

FIG. 5 is a schematic cross-sectional view of an organic photoelectric conversion element according to a fifth embodiment. An organic photoelectric conversion element 50 according to the fifth embodiment comprises a substrate 1, a first electrode 3a formed on the substrate 1, a buffer layer 5 formed on the first electrode 3a, an organic layer (an active layer) 2 formed on the buffer layer 5, and a second electrode 3b formed on the organic layer 2.

In the organic photoelectric conversion elements 10, 20, 30, 40 and 50 according to the first to fifth embodiments, the substrate 1 may be any substrate as long as it does not influence the formation of the electrodes 3a, 3b and the organic layer 2. Examples of materials for the substrate 1 include glass, plastics, polymeric films, silicon and the like.

The organic layer 2 is a layer with a thickness of ordinarily 1 nm to 100 μm and is preferably an organic thin film, whose thickness is preferably 2 nm to 1000 nm, more preferably 5 nm to 500 nm, far more preferably 20 nm to 200 nm from the viewpoint of the downsizing of the organic photoelectric conversion elements.

The organic layer 2 may be formed of the composition of the present invention. A method for producing the organic layer 2 is not particularly limited, and examples thereof include a method for forming a film of a liquid composition on an electrode, a method for vacuum depositing a composition onto an electrode, and the like.

Examples of the method for forming a film of the liquid composition include coating methods or printing methods such as a spin coating method, a casting method, a microgravure coating method, a gravure coating method, a bar coating method, a roll coating method, a wire bar coating method, a dip coating method, a spray coating method, a screen printing method, a flexographic printing method, a offset printing method, an ink-jet printing method, a dispenser printing method, a nozzle coating method and a capillary coating method; a spin coating method, a flexographic printing method, an ink-jet printing method and a dispenser printing method are preferable.

At least one of the first electrode 3a and the second electrode 3b is transparent or translucent. Examples of the transparent or translucent electrode include a conductive metal oxide film, a translucent metal thin film and the like.

Specific examples thereof include conductive glass made of such as indium oxide, zinc oxide, tin oxide, indium tin oxide (ITO), indium zinc oxide and antimony-doped tin oxide (NESA), and gold, platinum, silver, copper and the like; ITO, indium zinc oxide, tin oxide and the like are preferable. Examples of a method for producing the electrode include a vacuum deposition method, a sputtering method, an ion plating method, a plating method and the like. An organic transparent conductive film such as polyaniline and a derivative thereof and polythiophene and a derivative thereof may also be used as the electrode. In addition, metal, conductive polymer and the like may be used as the electrode materials. One of the pair of electrodes is preferably a material with small work function. Examples thereof include metals such as lithium, sodium, potassium, rubidium, cesium, magnesium, calcium, strontium, barium, aluminum, scandium, vanadium, zinc, yttrium, indium, cerium, samarium, europium, terbium and ytterbium; alloys of two or more kinds of them; alloys of one kind or more of them and one or more kind of gold, silver, platinum, copper, manganese, titanium, cobalt, nickel, tungsten and tin; and graphite or a graphite intercalation compound. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. In a case where the substrate 1 is opaque, an electrode farther from the substrate, that is, a second electrode 10b is preferably transparent or translucent.

The electric charge transport layer 4 contains an electron donor or an electron acceptor, and has a function of improving an electric charge (hole or electron) transport property of the organic photoelectric conversion element. Examples of the electron donor include a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine in a side chain or the main chain, polyaniline and a derivative thereof, polythiophene and a derivative thereof, polypyrrole and a derivative thereof, polyphenylene vinylene and a derivative thereof, and polythienylene vinylene and a derivative thereof. Examples of the electron acceptor include an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, 8-hydroxyquinoline and a metal complex of a derivative thereof, polyquinoline and a derivative thereof, polyquinoxaline and a derivative thereof, polyfluorene and a derivative thereof, a fullerene with $C_{60}$ and a derivative thereof, and a phenanthrene derivative such as bathocuproine.

The buffer layer 5 has a function as a hole blocking layer or an electron blocking layer, and has a function of improving photoelectric conversion efficiency of the organic photoelectric conversion element through the prevention of exciton extinction by cathode metal, the increase of open-circuit voltage, and the like. Examples of materials for the buffer layer 5 include halides (such as lithium fluoride), oxides and the like of alkali metals and alkaline-earth metals; particulates of inorganic semiconductors such as titanium oxide; and the like.

The organic photoelectric conversion element of the present invention is not limited to the above-mentioned first to fifth embodiments.

For example, the organic photoelectric conversion element of the present invention may not necessarily comprise the substrate 1.

Further, in the organic photoelectric conversion elements 20 and 30 according to the second and third embodiments, the electric charge transport layer 4 is provided between either the first electrode 3a or the second electrode 3b and the organic layer 2, but the organic photoelectric conversion element of the present invention may comprise the electric charge transport layers on both sides of the organic layer 2. For example, an electron transport layer may be provided between the first electrode 3a and the organic layer 2, and a hole transport layer may be provided between the second electrode 3b and the organic layer 2.

Furthermore, in the organic photoelectric conversion elements 40 and 50 according to the fourth and fifth embodiments, the buffer layer 5 is provided between either the first electrode 3a or the second electrode 3b and the organic layer 2, but the organic photoelectric conversion element of the present invention may comprise the buffer layers on both sides of the organic layer 2.

The organic photoelectric conversion element of the present invention may be operated as a solar cell in such a manner that light such as sunlight is irradiated from the transparent or translucent electrode to thereby generate photovoltaic power between the electrodes. The organic photoelectric conversion element may also be used as a solar cell module by accumulating the plural solar cells. Further, the organic photoelectric conversion element may be operated as an organic photosensor in such a manner that light is irradiated from the transparent or translucent electrode in the state of applying voltage between the electrodes to thereby generate a photocurrent. The organic photoelectric conversion element may also be used as an organic image sensor by accumulating the plural organic photosensors.

EXAMPLES

Hereinafter, the present invention will be described in further detail on the basis of examples and comparative examples, however, the invention is not limited to the following examples.

In the following examples, with regard to the molecular weight of a polymer, the number average molecular weight in terms of polystyrene was measured by GPC manufactured by Shimadzu Corporation (trade name: LC-10Avp) or GPC manufactured by GPC Laboratory (trade name: PL-GPC2000). In the case of measuring with LC-10Avp, the polymer was dissolved in tetrahydrofuran so as to become a concentration of approximately 0.5% by weight, and injected into GPC at a volume of 50 µL.

Tetrahydrofuran was used as a mobile phase of GPC and run at a flow rate of 0.6 mL/minute. Two of TSKgel SuperHM-H (manufactured by Tosoh Corporation) and one of TSKgel SuperH2000 (manufactured by Tosoh Corporation) were connected in series as the column. A differential refractometer (trade name: RID-10A, manufactured by Shimadzu Corporation) was used for the detector. In the case of measuring with PL-GPC2000, the polymer was dissolved in ortho-dichlorobenzene so as to become a concentration of approximately 1% by weight. Ortho-dichlorobenzene was used as a mobile phase of GPC and run at a flow rate of 1 mL/minute at a measuring temperature of 140° C. Three of PLGEL 10 μm MIXED-B (manufactured by PL Laboratory) were connected in series as the column.

Synthesis Example 1

Synthesis of Polymer 1

Into a 2-L four-necked flask whose atmosphere was replaced with argon, 7.928 g (16.72 mmol) of a compound represented by the following formula (A), 13.00 g (17.60 mmol) of a compound represented by the following formula (B), 4.979 g of methyltrioctyl ammonium chloride (trade name: aliquat336, manufactured by Aldrich, $CH_3N[(CH_2)_7CH_3]_3Cl$, density: 0.884 g/mL (25° C.), registered trademark of Henkel), and 405 mL of toluene were charged and subjected the inside system to argon bubbling for 30 minutes while stirring. 0.02 g of dichlorobis(triphenylphosphine)palladium (II) was added thereto and 42.2 mL of 2 mol/L of aqueous sodium carbonate solution was added dropwise thereto while increasing temperature to 105° C. and stirring. After the termination of dropwise addition, the solution was reacted for 5 hours, and 2.6 g of phenylboronic acid and 1.8 mL of toluene were added thereto and stirred at a temperature of 105° C. for 16 hours. In addition, 700 mL of toluene and 200 mL of 7.5% of aqueous sodium dimethyldithiocarbamate trihydrate solution were added thereto and stirred at a temperature of 85° C. for 3 hours. After removing the aqueous layer, the solution was washed twice with 300 mL of ion-exchange water at a temperature of 60° C., once with 300 mL of 3% of acetic acid at a temperature of 60° C. and additionally three times with 300 mL of ion-exchange water at a temperature of 60° C. The organic layer was passed through a column filled with sellite, alumina and silica to wash the column in 800 mL of hot toluene. The solution was concentrated up to 700 mL, thereafter poured into 2 L of methanol to be reprecipitated. The polymer was filtered, recovered and washed with 500 mL of methanol, acetone and methanol. The polymer was vacuum-dried at a temperature of 50° C. overnight to obtain 12.21 g of a pentathienyl-fluorene copolymer represented by the following formula (occasionally referred to as 'Polymer 1' in the present description). The number average molecular weight in terms of polystyrene of the Polymer 1 was $5.4\times10^4$ and the weight average molecular weight in terms of polystyrene thereof was $1.1\times10^5$.

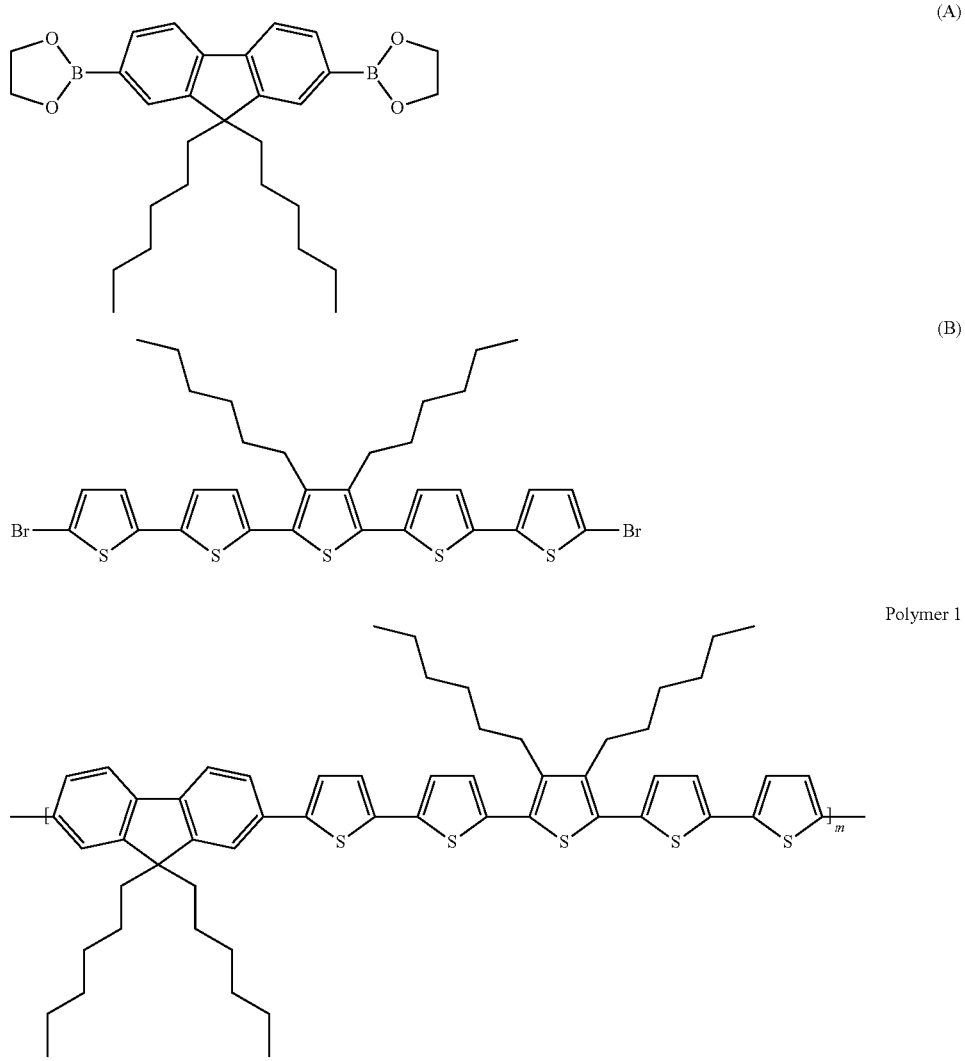

[In the formula, m denotes an integer of 2 or more.]

Synthesis Example 2

Synthesis of Polymer 2

Into a three-necked flask, 0.367 g (0.599 mmol) of a compound represented by the following formula (C), 0.206 g (0.630 mmol) of 5,5'-dibromo-2,2'-bithiophene, 0.4 mg of dichlorobis(triphenylphosphine)palladium (II), and 0.1 g of methyltrioctyl ammonium chloride (trade name: aliquat336, manufactured by Aldrich, $CH_3N[(CH_2)_7CH_3]_3Cl$, density: 0.884 g/mL (25° C.)) were charged under a nitrogen atmosphere, and 19 mL of toluene previously subjected to nitrogen bubbling for 30 minutes was added thereto. The obtained solution was heated up to a temperature of 105° C., and 2 mL of 2 mol/L of aqueous sodium carbonate solution was added dropwise thereto. After the termination of dropwise addition, the solution was heated to reflux for 3 hours. To the obtained solution, 0.01 g of phenylboronic acid was added, the mixture was further heated to reflux for 5 hours, and 0.1 g of sodium N,N-dimethyldithiocarbamate trihydrate and 2 mL of ion-exchange water were added thereto and stirred at a temperature of 90° C. for 3 hours. The obtained solution was cooled up to room temperature to thereafter remove the aqueous phase, and the organic phase was washed twice with 30 mL of ion-exchange water at a temperature of 60° C., twice with 2% by weight of acetic acid aqueous solution and additionally twice with ion-exchange water at a temperature of 60° C. The obtained organic phase was concentrated by an evaporator, and the obtained residue was purified by a silica gel-alumina column and precipitated in methanol to obtain 0.05 g of a polymer represented by the following formula (occasionally referred to as 'Polymer 2' in the present specification). The number average molecular weight in terms of polystyrene of the Polymer 2 was $2.5 \times 10^3$ and the weight average molecular weight in terms of polystyrene thereof was $4.9 \times 10^3$.

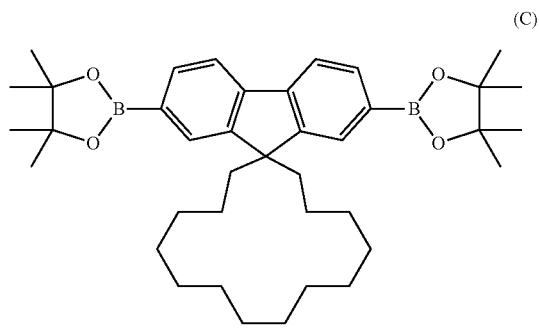

(C)

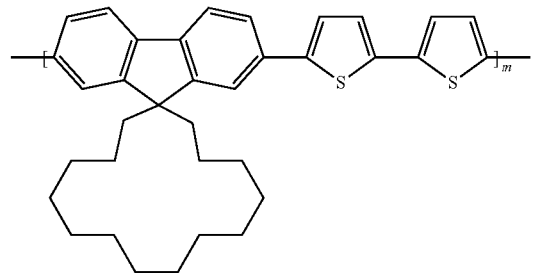

Polymer 2

[In the formula, m denotes an integer of 2 or more.]

Examples 1 to 3 and Comparative Examples 1 to 5

Production of Coating Solution for Organic Thin Film Solar Cell

The electron donor and the electron acceptor shown in the following Table 1 were dissolved in ortho-dichlorobenzene at the mixing ratio (electron donor/electron acceptor) shown in Table 1. The obtained solution was filtered through a 0.2 μm Teflon (registered trademark) filter to obtain a coating solution. The content (% by weight) of a solid content (solid component) in the coating solution is as shown in Table 1. [70]PCBM, [60]PCBM and P3HT in the table denote methyl [6,6]-phenyl-$C_{71}$-butyrate, methyl[6,6]-phenyl-$C_{61}$-butyrate and poly(3-hexylthiophene), respectively. The following products were used as [70]PCBM, [60]PCBM and P3HT.

[70] PCBM: ADS71BFA manufactured by American Dye Source, Inc.

[60]PCBM: nanom spectra E-100 manufactured by Frontier Carbon Corporation

P3HT: regioregular poly(3-hexylthiophene) (manufactured by Aldrich)

(Production and Evaluation of Organic Thin Film Solar Cell)

A glass substrate with an ITO film having a thickness of 150 nm using a sputtering method was subjected to ozone UV treatment as surface treatment. The above-mentioned coating solution was coated onto the obtained surface-treated glass substrate using a spin coating method to obtain an organic layer (an active layer) (film thickness: 100 nm). The element using P3HT as an electron donor was subject to baking under a nitrogen atmosphere at a temperature of 130° C. for 10 minutes after coating. Thereafter, 4 nm of lithium fluoride and subsequently 100 nm of aluminum were deposited on the organic layer by a vacuum depositing machine to thereby produce an organic thin film solar cell (shape: a square of 2 mm×2 mm). The degree of vacuum in depositing was all 1 to $9 \times 10^{-3}$ Pa. The characteristics (photoelectric conversion efficiency, open-circuit voltage and short-circuit current density) of the obtained organic thin film solar cell were measured with a solar simulator (manufactured by Bunkoh-keiki Co., LTD., trade name: OTENTO-SUN II, AM1.5G filter, irradiance: 100 mW/cm²). The results are shown in the following Table 1.

TABLE 1

| | organic layer | | mixing | | | | short-circuit |
| | electron donative compound | electron accepting compound | ratio (weight ratio) | solid content (% by weight) | photoelectric conversion efficiency (%) | open-circuit voltage (V) | current density (mA/cm²) |
| --- | --- | --- | --- | --- | --- | --- | --- |
| Example 1 | Polymer 1 | [70] PCBM | 1/3 | 2.0 | 4.7 | 0.86 | 8.9 |
| Example 2 | Polymer 1 | [70] PCBM | 1/5 | 3.0 | 5.1 | 0.87 | 9.2 |

TABLE 1-continued

|  | organic layer | | mixing | | | | short-circuit |
|---|---|---|---|---|---|---|---|
|  | electron donative compound | electron accepting compound | ratio (weight ratio) | solid content (% by weight) | photoelectric conversion efficiency (%) | open-circuit voltage (V) | current density (mA/cm$^2$) |
| Example 3 | Polymer 2 | [70] PCBM | 1/3 | 2.0 | 3.5 | 0.92 | 8.2 |
| Comparative Example 1 | Polymer 1 | [60] PCBM | 1/3 | 2.0 | 3.0 | 0.86 | 5.4 |
| Comparative Example 2 | Polymer 1 | [60] PCBM | 1/5 | 3.0 | 2.9 | 0.86 | 5.1 |
| Comparative Example 3 | Polymer 2 | [60] PCBM | 1/3 | 2.0 | 2.1 | 0.95 | 5.0 |
| Comparative Example 4 | P3HT | [60] PCBM | 1/1 | 2.0 | 2.0 | 0.57 | 7.4 |
| Comparative Example 5 | P3HT | [70] PCBM | 1/1 | 2.0 | 1.8 | 0.60 | 7.6 |

As clarified from Table 1, the organic thin film solar cells (Examples 1 to 3) in which Polymer 1 or 2 was used as an electron donor and [70]PCBM was used as an electron acceptor offered remarkably high photoelectric conversion efficiency as compared with the organic thin film solar cells (Comparative Examples 1 to 3) in which Polymer 1 or 2 was used as an electron donor and [60]PCBM was used as an electron acceptor. A large difference was not observed in photoelectric conversion efficiency between the organic thin film solar cell (Comparative Example 5) in which P3HT was used as an electron donor and [70]PCBM was used as an electron acceptor and the organic thin film solar cell (Comparative Example 4) in which P3HT was used as an electron donor and [60]PCBM was used as an electron acceptor.

Examples 1 to 3 and Comparative Examples 1 to 5 showed that the composition of the present invention allowed an organic photoelectric conversion element with remarkably high photoelectric conversion efficiency to be produced. Also, it was shown that the organic photoelectric conversion element of the present invention had remarkably high photoelectric conversion efficiency.

INDUSTRIAL APPLICABILITY

The present invention provides an organic photoelectric conversion element with sufficiently high photoelectric conversion efficiency, and an organic material capable of producing such an organic photoelectric conversion element.

The invention claimed is:

1. A composition containing a polymer having a structural unit represented by the following formula (1) and a structural unit represented by the following formula (2), and a fullerene derivative having a fullerene skeleton with a carbon number of 70 or more:

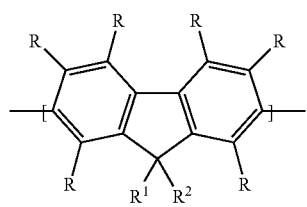

(1)

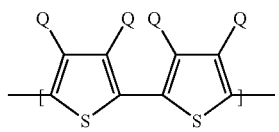

(2)

wherein in the formulae (1) and (2), Q, R, R$^1$ and R$^2$ each independently denote a hydrogen atom, a fluorine atom, an alkyl group with a carbon number of 1 to 20, an alkoxy group with a carbon number of 1 to 20, or an optionally substituted aryl group with a carbon number of 6 to 60, wherein, a part or all of hydrogen atoms in the alkyl group with a carbon number of 1 to 20, the alkoxy group with a carbon number of 1 to 20, and the optionally substituted aryl group with a carbon number of 6 to 60 may be substituted with fluorine atoms, R$^1$ and R$^2$ may be bonded together to form a ring, and Q's and R's may be the same or different; and the fullerene derivative having a fullerene skeleton with a carbon number of 70 or more is selected from the group consisting of the following formulae:

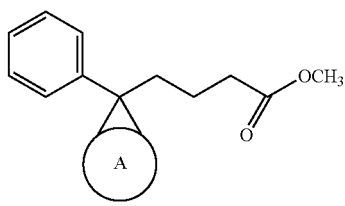

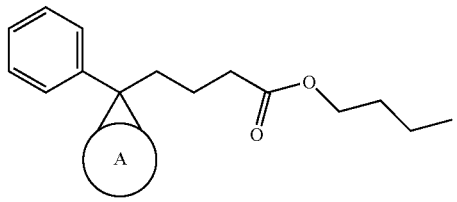

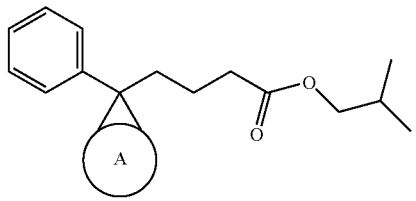

31

-continued

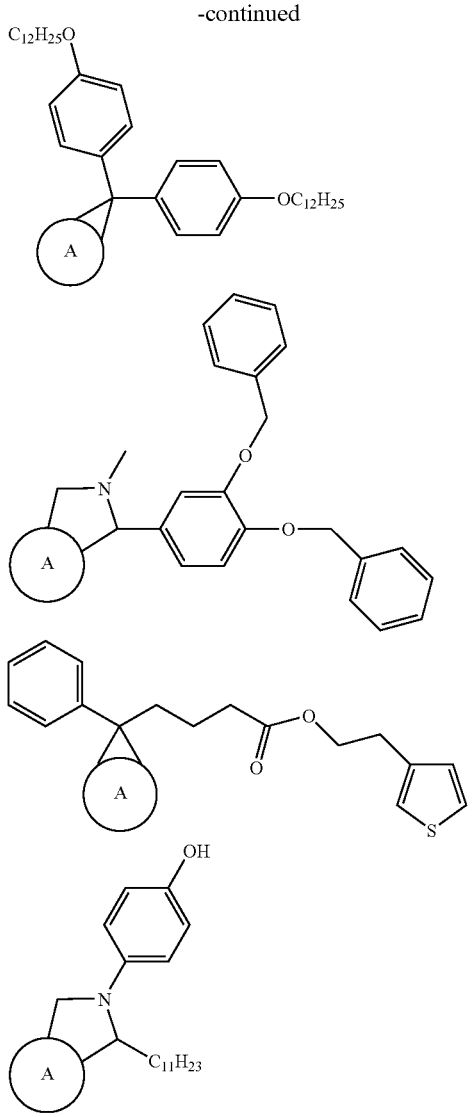

where A denotes a fullerene skeleton with a carbon number of 70 or more and in a fullerene derivative represented by each of the formulae, two adjacent carbon atoms in the fullerene skeleton form a cyclopropane ring or a pyrrolidine ring together with atoms in an additional group.

2. The composition according to claim 1, wherein all of Q's are hydrogen atoms.

3. The composition according to claim 1, wherein all of R's are hydrogen atoms.

4. The composition according to claim 1, wherein said polymer is a polymer having a structural unit represented by the following formula (I):

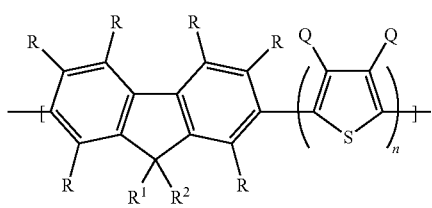

32 wherein in the formula (I), Q, R, $R^1$ and $R^2$ have the same meanings as described above, and n is an integer of 2 or more.

5. The composition according to claim 4, wherein the structural unit represented by the formula (I) is a structural unit represented by the following formula (II):

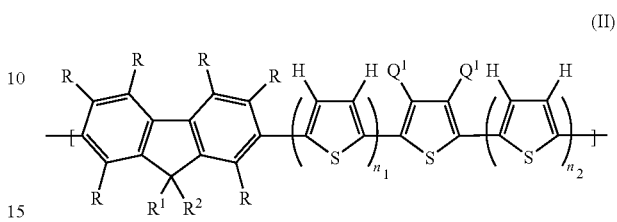

wherein in the formula (II), R, $R^1$ and $R^2$ have the same meanings as described above, $Q^1$ denotes an alkyl group with a carbon number of 1 to 20, an alkoxy group with a carbon number of 1 to 20, or an optionally substituted aryl group with a carbon number of 6 to 60, wherein, a part or all of hydrogen atoms in the alkyl group with a carbon number of 1 to 20, the alkoxy group with a carbon number of 1 to 20, and the optionally substituted aryl group with a carbon number of 6 to 60 may be substituted with fluorine atoms, $Q^1$'s may be the same or different, $n_1$ and $n_2$ are integers of 0 or more and $n_1+n_2 \geq 1$.

6. The composition according to claim 4, wherein the structural unit represented by the formula (I) is a structural unit represented by the following formula (III):

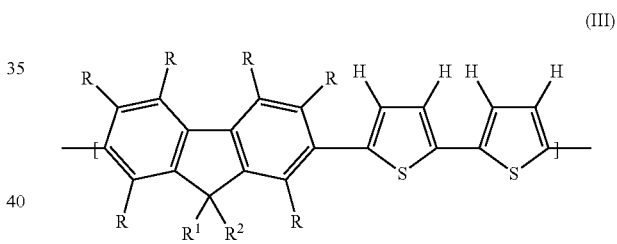

wherein in the formula (III), R, $R^1$ and $R^2$ have the same meanings as described above.

7. The composition according to claim 1, wherein the fullerene skeleton is that with a carbon number of 70.

8. An organic photoelectric conversion element comprising:
a pair of electrodes at least one of which is transparent or translucent; and
an organic layer provided between the pair of electrodes;
wherein said organic layer is formed of the composition according to claim 1.

9. An organic photoelectric conversion element comprising:
a pair of electrodes at least one of which is transparent or translucent; and
an organic layer provided between the pair of electrodes;
wherein said organic layer contains the composition according to claim 1.

10. The composition according to claim 1, wherein the fullerene derivative is [70]PCBM.

* * * * *